US010475658B2

(12) United States Patent
Bilodeau et al.

(10) Patent No.: US 10,475,658 B2
(45) Date of Patent: Nov. 12, 2019

(54) FORMULATIONS TO SELECTIVELY ETCH SILICON AND GERMANIUM

(71) Applicant: ENTEGRIS, INC., Billerica, MA (US)

(72) Inventors: Steven Bilodeau, Oxford, CT (US); Emanuel I. Cooper, Scarsdale, NY (US)

(73) Assignee: ENTEGRIS, INC., Billerica, MA (US)

( * ) Notice: Subject to any disclaimer, the term of this patent is extended or adjusted under 35 U.S.C. 154(b) by 0 days.

(21) Appl. No.: 15/108,696

(22) PCT Filed: Dec. 29, 2014

(86) PCT No.: PCT/US2014/072571
§ 371 (c)(1),
(2) Date: Jun. 28, 2016

(87) PCT Pub. No.: WO2015/103146
PCT Pub. Date: Jul. 9, 2015

(65) Prior Publication Data
US 2016/0343576 A1 Nov. 24, 2016

Related U.S. Application Data

(60) Provisional application No. 61/922,187, filed on Dec. 31, 2013.

(51) Int. Cl.
*H01L 21/306* (2006.01)
*H01L 21/3213* (2006.01)

(52) U.S. Cl.
CPC .. *H01L 21/30604* (2013.01); *H01L 21/32134* (2013.01)

(58) Field of Classification Search
CPC .................. H01L 21/30604; H01L 21/32134
See application file for complete search history.

(56) References Cited

U.S. PATENT DOCUMENTS

| 5,320,709 | A | 6/1994 | Bowden |
| 5,702,075 | A | 12/1997 | Lehrman |
| 5,976,928 | A | 11/1999 | Kirlin et al. |
| 5,993,685 | A | 11/1999 | Currie et al. |
| 6,194,366 | B1 | 2/2001 | Naghshineh et al. |
| 6,211,126 | B1 | 4/2001 | Wojtczak et al. |
| 6,224,785 | B1 | 5/2001 | Wojtczak et al. |
| 6,280,651 | B1 | 8/2001 | Wojtczak et al. |
| 6,306,807 | B1 | 10/2001 | Wojtczak et al. |
| 6,316,370 | B1 | 11/2001 | Mercaldi et al. |
| 6,322,600 | B1 | 11/2001 | Brewer et al. |
| 6,323,168 | B1 | 11/2001 | Kloffenstein et al. |
| 6,344,432 | B1 | 2/2002 | Wojtczak et al. |
| 6,346,741 | B1 | 2/2002 | Van Buskirk et al. |
| 6,395,194 | B1 | 5/2002 | Russell et al. |
| 6,409,781 | B1 | 6/2002 | Wojtczak et al. |
| 6,492,308 | B1 | 12/2002 | Naghshineh et al. |
| 6,527,819 | B2 | 3/2003 | Wojtczak et al. |
| 6,566,315 | B2 | 5/2003 | Wojtczak et al. |
| 6,627,587 | B2 | 9/2003 | Naghshineh et al. |
| 6,723,691 | B2 | 4/2004 | Naghshineh et al. |
| 6,735,978 | B1 | 5/2004 | Tom et al. |
| 6,755,989 | B2 | 6/2004 | Wojtczak et al. |
| 6,773,873 | B2 | 8/2004 | Seijo et al. |
| 6,800,218 | B2 | 10/2004 | Ma et al. |
| 6,802,983 | B2 | 10/2004 | Mullee et al. |
| 6,849,200 | B2 | 2/2005 | Baum et al. |
| 6,875,733 | B1 | 4/2005 | Wojtczak |
| 6,896,826 | B2 | 5/2005 | Wojtczak et al. |
| 6,943,139 | B2 | 9/2005 | Korzenski et al. |
| 6,989,358 | B2 | 1/2006 | Korzenski et al. |
| 7,011,716 | B2 | 3/2006 | Xu et al. |
| 7,029,373 | B2 | 4/2006 | Ma et al. |
| 7,030,168 | B2 | 4/2006 | Xu et al. |
| 7,119,052 | B2 | 10/2006 | Korzenski et al. |
| 7,119,418 | B2 | 10/2006 | Xu et al. |
| 7,160,815 | B2 | 1/2007 | Korzenski et al. |
| 7,223,352 | B2 | 5/2007 | Korzenski et al. |
| 7,300,601 | B2 | 11/2007 | Liu et al. |
| 7,326,673 | B2 | 2/2008 | Xu et al. |
| 7,335,239 | B2 | 2/2008 | Baum |
| 7,361,603 | B2 | 4/2008 | Liu et al. |
| 7,365,045 | B2 | 4/2008 | Walker et al. |
| 7,485,611 | B2 | 2/2009 | Roeder et al. |
| 7,534,752 | B2 | 5/2009 | Wojtczak et al. |
| 7,553,803 | B2 | 6/2009 | Korzenski et al. |
| 7,557,073 | B2 | 7/2009 | Korzenski et al. |
| 7,736,405 | B2 | 6/2010 | Darsillo et al. |
| 7,888,301 | B2 | 2/2011 | Bernhard et al. |
| 7,922,824 | B2 | 4/2011 | Minsek et al. |

(Continued)

FOREIGN PATENT DOCUMENTS

| JP | 2011159658 A | 8/2011 |
| JP | 2012021151 A | 2/2012 |
| JP | 2012062572 A | 3/2012 |
| JP | 2012186470 A | 9/2012 |
| JP | 2012251026 A | 12/2012 |
| TW | 200947555 A | 11/2009 |
| TW | 201250818 A | 12/2012 |
| WO | 2006110645 A2 | 10/2006 |
| WO | 2006127885 A1 | 11/2006 |
| WO | 2007027522 A2 | 3/2007 |
| WO | 2008036823 A2 | 3/2008 |
| WO | 2008157345 A2 | 12/2008 |
| WO | 2009073596 A2 | 6/2009 |

(Continued)

OTHER PUBLICATIONS

International Search Report, dated Mar. 31, 2015.

*Primary Examiner* — Duy Vu N Deo

(74) *Attorney, Agent, or Firm* — Entegris, Inc.

(57) ABSTRACT

Compositions useful for the selective removal of silicon-containing materials relative to germanium-containing materials, and vice versa, from a microelectronic device having same thereon. The removal compositions include at least one diol and are tunable to achieve the required Si:Ge removal selectivity and etch rates.

11 Claims, No Drawings

(56) References Cited

U.S. PATENT DOCUMENTS

| | | | |
|---|---|---|---|
| 7,923,423 B2 | 4/2011 | Walker et al. | |
| 7,960,328 B2 * | 6/2011 | Visintin | H01L 21/02079 134/1.3 |
| 8,026,200 B2 | 9/2011 | Cooper et al. | |
| 8,058,219 B2 | 11/2011 | Rath et al. | |
| 8,114,220 B2 | 2/2012 | Visintin et al. | |
| 8,178,585 B2 | 5/2012 | Petruska et al. | |
| 8,236,485 B2 | 8/2012 | Minsek et al. | |
| 8,304,344 B2 | 11/2012 | Boggs et al. | |
| 8,338,087 B2 | 12/2012 | Rath et al. | |
| 8,367,555 B2 | 2/2013 | Afzali-Ardakani et al. | |
| 8,618,036 B2 | 12/2013 | Afzali-Ardakani et al. | |
| 8,685,909 B2 | 4/2014 | Angst et al. | |
| 8,754,021 B2 | 6/2014 | Barnes et al. | |
| 8,778,210 B2 | 7/2014 | Cooper et al. | |
| 8,951,948 B2 | 2/2015 | Rath et al. | |
| 9,045,717 B2 | 6/2015 | Nakanishi et al. | |
| 9,063,431 B2 | 6/2015 | Barnes et al. | |
| 9,074,169 B2 | 7/2015 | Chen et al. | |
| 9,074,170 B2 | 7/2015 | Barnes et al. | |
| 9,175,404 B2 | 11/2015 | Kojima et al. | |
| 9,215,813 B2 | 12/2015 | Brosseau et al. | |
| 9,221,114 B2 | 12/2015 | Chen et al. | |
| 9,238,850 B2 | 1/2016 | Korzenski et al. | |
| 9,416,338 B2 | 8/2016 | Cooper et al. | |
| 2005/0118832 A1 | 6/2005 | Korzenski et al. | |
| 2005/0145311 A1 | 7/2005 | Walker et al. | |
| 2005/0227482 A1 | 10/2005 | Korzenski et al. | |
| 2005/0263490 A1 | 12/2005 | Liu et al. | |
| 2006/0019850 A1 | 1/2006 | Korzenski et al. | |
| 2006/0063687 A1 | 3/2006 | Minsek et al. | |
| 2006/0148666 A1 | 7/2006 | Peters et al. | |
| 2006/0154186 A1 | 7/2006 | Minsek et al. | |
| 2006/0249482 A1 | 11/2006 | Wrschka et al. | |
| 2007/0090325 A1 * | 4/2007 | Hwang | H01L 21/31111 252/79.1 |
| 2007/0251551 A1 | 11/2007 | Korzenski et al. | |
| 2008/0076688 A1 | 3/2008 | Barnes et al. | |
| 2008/0125342 A1 | 5/2008 | Visintin et al. | |
| 2008/0271991 A1 | 11/2008 | Korzenski et al. | |
| 2009/0032766 A1 | 2/2009 | Rajaratnam et al. | |
| 2009/0192065 A1 | 7/2009 | Korzenski et al. | |
| 2009/0212021 A1 | 8/2009 | Bernhard et al. | |
| 2009/0215269 A1 | 8/2009 | Boggs et al. | |
| 2009/0246967 A1 | 10/2009 | Yahuchi et al. | |
| 2009/0253072 A1 | 10/2009 | Petruska et al. | |
| 2009/0301996 A1 | 12/2009 | Visintin et al. | |
| 2010/0056410 A1 | 3/2010 | Visintin et al. | |
| 2010/0065530 A1 | 3/2010 | Walker et al. | |
| 2010/0087065 A1 | 4/2010 | Boggs et al. | |
| 2010/0112728 A1 | 5/2010 | Korzenski et al. | |
| 2010/0140746 A1 | 6/2010 | Radouane et al. | |
| 2010/0163788 A1 | 7/2010 | Visintin et al. | |
| 2010/0261632 A1 | 10/2010 | Korzenski et al. | |
| 2010/0286014 A1 | 11/2010 | Barnes | |
| 2010/0304570 A1 * | 12/2010 | Horie | H01L 21/30621 438/710 |
| 2011/0039747 A1 | 2/2011 | Zhou et al. | |
| 2011/0117751 A1 | 5/2011 | Sonthalia et al. | |
| 2011/0287634 A1 | 11/2011 | Barr | |
| 2013/0196497 A1 | 8/2013 | Shimada et al. | |
| 2013/0270217 A1 | 10/2013 | Yoshida et al. | |
| 2013/0280123 A1 | 10/2013 | Chen et al. | |
| 2013/0295712 A1 | 11/2013 | Chen et al. | |
| 2014/0038420 A1 | 2/2014 | Chen et al. | |
| 2014/0306162 A1 | 10/2014 | Poe et al. | |
| 2014/0318584 A1 | 10/2014 | Cooper et al. | |
| 2014/0319423 A1 | 10/2014 | Cooper | |
| 2015/0027978 A1 | 1/2015 | Barnes et al. | |
| 2015/0045277 A1 | 2/2015 | Liu et al. | |
| 2015/0050199 A1 | 2/2015 | Korzenski et al. | |
| 2015/0075570 A1 | 3/2015 | Wu et al. | |
| 2015/0114429 A1 | 4/2015 | Jenq et al. | |
| 2015/0162213 A1 | 6/2015 | Chen et al. | |
| 2015/0168843 A1 | 6/2015 | Cooper et al. | |
| 2015/0344825 A1 | 12/2015 | Cooper et al. | |
| 2016/0020087 A1 | 1/2016 | Liu et al. | |
| 2016/0032186 A1 | 2/2016 | Chen et al. | |
| 2016/0075971 A1 | 3/2016 | Liu et al. | |
| 2016/0122696 A1 | 5/2016 | Liu et al. | |
| 2016/0130500 A1 | 5/2016 | Chen et al. | |
| 2016/0185595 A1 | 6/2016 | Chen et al. | |
| 2016/0200975 A1 | 7/2016 | Cooper et al. | |
| 2016/0314990 A1 | 10/2016 | Bilodeau et al. | |
| 2016/0322232 A1 | 11/2016 | Bilodeau et al. | |

FOREIGN PATENT DOCUMENTS

| | | |
|---|---|---|
| WO | 2010017160 A2 | 2/2010 |
| WO | 2010039936 A2 | 4/2010 |
| WO | 2010086745 A1 | 8/2010 |
| WO | 2010091045 A2 | 8/2010 |
| WO | 2012154498 A2 | 11/2012 |
| WO | 2012174518 A2 | 12/2012 |
| WO | 2013058770 A1 | 4/2013 |
| WO | 2013138278 A1 | 9/2013 |
| WO | 2015130607 A1 | 9/2015 |

* cited by examiner

FORMULATIONS TO SELECTIVELY ETCH SILICON AND GERMANIUM

CROSS-REFERENCE TO RELATED APPLICATIONS

This application is filed under the provisions of 35 U.S.C. § 371 and claims the priority of International Patent Application No. PCT/US2014/072571 filed on 29 Dec. 2014 entitled "FORMULATIONS TO SELECTIVELY ETCH SILICON AND GERMANIUM" in the name of Steven BILODEAU, et al., which claims priority to U.S. Provisional Patent Application No. 61/922,187 filed on 31 Dec. 2013, both of which are hereby incorporated by reference herein in their entirety.

FIELD

The present invention relates to a composition and process for selectively etching silicon-containing materials relative to germanium-containing materials and vice versa.

DESCRIPTION OF THE RELATED ART

For the past several decades, the scaling of features in integrated circuits has enabled increased densities of functional units on a semiconductor chip. For example, shrinking transistor size allows for the incorporation of an increased number of memory devices on a chip, leading to the fabrication of products with increased capacity.

In the manufacture of field effect transistors (FETs) for integrated circuit devices, semiconducting crystalline materials other than silicon may be advantageous. An example of one such material is Ge, which offers a number of potentially advantageous features relative to silicon, such as, but not limited to, high charge carrier (hole) mobility, band gap offset, a different lattice constant, and the ability to alloy with silicon to form semiconducting binary alloys of SiGe.

One problem with the use of Ge in modern transistor designs is that the extremely fine features (e.g., 22 nm and below) that are now achieved for silicon FETs aggressively scaled over the years are now difficult to achieve in Ge, often making potential material-based performance gains a wash when implemented in less-aggressively scaled forms. The difficulty in scaling is related to the material properties of Ge, and more particularly difficulty in etching SiGe, which is often employed as an intermediate layer between a Ge active layer (e.g., transistor channel layer) and an underlying silicon substrate material.

An object of the present invention is to provide compositions for the selective removal of silicon-containing materials relative to germanium-containing materials, and vice versa, while minimizing the removal or corrosion of other materials that are present on the microelectronic device. Further, it is an object of the present invention to provide a composition for the non-selective etch of silicon-containing and germanium-containing materials such that such that said materials are etched at substantially the same rate.

SUMMARY OF THE INVENTION

The present invention relates to a composition and process for selectively etching silicon-containing materials relative to germanium-containing materials, and vice versa, from a microelectronic device comprising same.

In one aspect, a method of selectively removing silicon-containing material from the surface of a microelectronic device relative to germanium-containing material is described, said method comprising contacting a silicon selective composition with the surface of the microelectronic device for time and temperature necessary to selectively remove silicon-containing material relative to germanium-containing material, wherein the silicon selective composition comprises at least one diol compound, at least one fluoride species, and at least one oxidizing species.

In another aspect, a method of selectively removing germanium-containing material from the surface of a microelectronic device relative to silicon-containing material is described, said method comprising contacting a germanium selective composition with the surface of the microelectronic device for time and temperature necessary to selectively remove germanium-containing material relative to silicon-containing material, wherein the germanium selective composition comprises at least one diol compound and water.

Other aspects, features and embodiments of the invention will be more fully apparent from the ensuing disclosure and appended claims.

DETAILED DESCRIPTION, AND PREFERRED EMBODIMENTS THEREOF

In general, the present invention relates to compositions that selectively remove silicon-containing materials relative to germanium-containing materials, and vice versa, and hence are useful as etchants for at least partial removal of material from a microelectronic device. The present invention discloses how the compositions can be tuned to remove Si-containing materials relative to Ge-containing materials or Ge-containing materials relative to Si-containing materials.

For ease of reference, "microelectronic device" corresponds to semiconductor substrates, flat panel displays, phase change memory devices, solar panels and other products including solar cell devices, photovoltaics, and microelectromechanical systems (MEMS), manufactured for use in microelectronic, integrated circuit, energy collection, or computer chip applications. It is to be understood that the terms "microelectronic device," "microelectronic substrate" and "microelectronic device structure" are not meant to be limiting in any way and include any substrate or structure that will eventually become a microelectronic device or microelectronic assembly. The microelectronic device can be patterned, blanketed, a control and/or a test device.

"Silicon" may be defined to include, Si, polycrystalline Si, and monocrystalline Si. Silicon is comprised in silicon-on-insulator (SOI) wafers that may be used, for example, as substrates or part of a substrate for electronic devices such as FETs and integrated circuits. Other types of wafers may also comprise silicon.

As used herein, "silicon-containing materials" correspond to silicon; p-doped silicon; n-doped silicon; silicon oxide, including gate oxides (e.g., thermally or chemically grown $SiO_2$) and TEOS; silicon nitride; thermal oxide; SiOH; SiCOH; titanium silicide; tungsten silicide; nickel silicides; cobalt silicides; and low-k dielectric materials. As defined herein, "low-k dielectric material" corresponds to any material used as a dielectric material in a layered microelectronic device, wherein the material has a dielectric constant less than about 3.5. Preferably, the low-k dielectric materials include low-polarity materials such as silicon-containing organic polymers, silicon-containing hybrid organic/inorganic materials, organosilicate glass (OSG), TEOS, fluorinated silicate glass (FSG), silicon dioxide, and carbon-doped oxide (CDO) glass. It is to be appreciated that the low-k dielectric materials may have varying densities and varying porosities.

As described herein, the "silicon oxide" or "$SiO_2$" material corresponds to materials that were deposited from a silicon oxide precursor source, e.g., TEOS, thermally deposited silicon oxide, or carbon doped oxides (CDO) deposited using commercially available precursors such as SiLK™, AURORA™, CORAL™, or BLACK DIAMOND™. For the purposes of this description, "silicon oxide" is meant to broadly include $SiO_2$, CDO's, siloxanes and thermal oxides. Silicon oxide or $SiO_2$ material corresponds to pure silicon oxide ($SiO_2$) as well as impure silicon oxide including impurities in the structure.

As used herein, "fluoride" species correspond to species including an ionic fluoride ($F^-$) or covalently bonded fluorine. It is to be appreciated that the fluoride species may be included as a fluoride species or generated in situ.

As defined herein, the "germanium-containing materials" may be a bulk germanium wafer, n-doped germanium, p-doped germanium, a germanium-on-insulator (GOI) wafer in which case the layer is a germanium layer formed on a dielectric layer on top of the substrate, a germanium layer on a substrate, as well as germanium compounds such as titanium germanide, tungsten germanide, nickel germanide, and cobalt germanide. The germanium-containing material can be a continuous layer that at least partially extends over the substrate or can be divided into separate regions.

Silicon-germanium (SiGe) is known in the art. Depending on the percentage of Si relative to Ge in the SiGe material, the SiGe may be loosely categorized as Si-containing material or Ge-containing material. For example, if the SiGe material has a silicon content greater than 50 wt %, it will be considered Si-containing material for the purposes of this disclosure. If the SiGe material has a germanium content greater than 50 wt %, it will be considered Ge-containing material for the purposes of this disclosure. If Si is being removed relative to SiGe (or vice versa), it should be understood that the SiGe is the germanium-containing material, regardless of the atomic makeup of the SiGe. If Ge is being removed relative to SiGe (or vice versa), it should be understood that the SiGe is the silicon-containing material, regardless of the atomic makeup of the SiGe.

As used herein, "about" is intended to correspond to ±5% of the stated value.

It is understood that some chemical components naturally include negligible amounts of water when in their lowest energy, i.e., stable, state, particularly as purchased commercially. For the purpose of this description, naturally present water is not considered "added water".

Compositions of the invention may be embodied in a wide variety of specific formulations, as hereinafter more fully described.

In all such compositions, wherein specific components of the composition are discussed in reference to weight percentage ranges including a zero lower limit, it will be understood that such components may be present or absent in various specific embodiments of the composition, and that in instances where such components are present, they may be present at concentrations as low as 0.001 weight percent, based on the total weight of the composition in which such components are employed.

In a first aspect, a composition for selectively removing silicon-containing material from the surface of a microelectronic device relative to germanium-containing material (hereinafter the silicon selective composition) and a method of using same is described, said composition comprising, consisting of, or consisting essentially of at least one diol compound, at least one fluoride species, and at least one oxidizing species. In another embodiment, the silicon selective composition comprises, consists of, or consists essentially of at least one diol compound, at least one fluoride species, at least one oxidizing species, and water.

Diol species contemplated herein include include aliphatic glycols including, but not limited to, ethylene glycol, neopentyl glycol, propylene glycol, 1,3-propanediol, 1,2-butanediol, 1,3-butanediol, 1,4-butanediol, 1,2-pentanediol, 1,3-pentanediol, 1,4-pentanediol, 2,3-butanediol, 3-methyl-1,2-butanediol, 1,5-pentanediol, 2-methyl-1,3-pentanediol, 2,4-pentanediol, 2-methyl-2,4-pentanediol, 2,3-pentanediol, 1,2-hexanediol, 2-ethyl-1,3-hexanediol, 2,5-dimethyl-2,5-hexanediol, 1,2-octanediol and combinations thereof. Species containing more than two hydroxyl groups, such as triols (e.g., glycerol), and species in which there are two available hydroxyls and a third that is esterified or etherified (e.g., glyceryl caprylate, guayacol glyceryl ether) are also contemplated. Preferably, the at least one diol species comprises 1,2-butanediol. The amount of diol species is in a range from about 70 wt % to about 99 wt %, preferably greater than about 75 wt % to about 98.8 wt %.

Fluoride species contemplated include hydrofluoric acid. Alternatively, fluoride sources other than HF may be beneficial when lower etch rates of silicon-containing materials are required including, but not limited to, hexafluorotitanic acid, hexafluorosilicic acid, hexafluorozirconic acid, tetrafluoboric acid, tetrabutylammonium trifluoromethanesulfonate, tetraalkylammonium tetrafluoroborates ($NR_1R_2R_3R_4BF_4$) such as tetrabutylammonium tetrafluoroborate, tetraalkylammonium hexafluorophosphates ($NR_1R_2R_3R_4PF_6$), tetraalkylammonium fluorides ($NR_1R_2R_3R_4F$) (anhydrous or hydrates thereof) such as tetramethylammonium fluoride, ammonium bifluoride, ammonium fluoride, where $R_1$, $R_2$, $R_3$, $R_4$ may be the same as or different from one another and is selected from the group consisting of hydrogen, straight-chained or branched $C_1$-$C_6$ alkyl groups (e.g., methyl, ethyl, propyl, butyl, pentyl, hexyl), $C_1$-$C_6$ alkoxy groups (e.g., hydroxyethyl, hydroxypropyl) substituted or unsubstituted aryl groups (e.g., benzyl). Preferably, the fluoride species comprises hydrofluoric acid. The amount of fluoride species is in a range from about 0.01 wt % to about 5 wt %, preferably about 0.1 wt % to 1 wt %.

Oxidizing species contemplated herein include, but are not limited to, hydrogen peroxide, $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), periodic acid, iodic acid, vanadium (V) oxide, vanadium (IV, V) oxide, ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, nitric acid, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, peracetic acid, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), chloranil, alloxan, N-methylmorpholine N-oxide, trimethylamine N-oxide, and combinations thereof. The oxidizing species may be introduced to the composition at the manufacturer, prior to introduction of the composition to the device wafer, or alternatively at the device wafer, i.e., in situ. Preferably, the oxidizing species comprises a quinone compound, hydrogen peroxide, peracetic acid, ammonium iodate, or any combination thereof. When present, the amount of oxidizing species is in a range from about 0.01 wt % to about 10 wt %, preferably about 0.1 wt % to 1 wt %.

When present, the water is preferably deionized and present in an amount from about 0.1 wt % to about 40 wt %. Preferably, the amount of water in the silicon selective composition is in a range from about 0.1 wt % to about 30 wt %, and even more preferably about 0.1 wt % to about 20 wt %.

It should be appreciated that the silicon selective composition can be tuned to alter the etch rates of the silicon-containing materials, the germanium-containing materials and the silicon-containing materials relative to the germanium-containing materials, as readily understood and determined by the person skilled in the art. Most preferably, the selectivity of silicon-containing compounds:germanium-containing compounds (Si:Ge) at 25° C. is greater than 3:1, more preferably greater than 4:1, and most preferably equal to or greater than 5:1, with silicon-containing material etch rates greater than about 4 Å/min with weaker oxidants, or as high as about 33 Å/min with a stronger oxidant.

In one embodiment, the silicon selective composition of the first aspect comprises, consists of, or consists essentially of 1,2-, 1,3-, or 1,4-butanediol, HF, water, and methyl-1,4-benzoquinone.

In a second aspect, a composition for selectively removing germanium-containing material from the surface of a microelectronic device relative to silicon-containing material (hereinafter the germanium selective composition) and a method of using same is described, said composition comprising, consisting of, or consisting essentially of at least one diol compound and water. In another embodiment, the germanium selective composition comprises, consists of, or consists essentially of at least one diol compound, at least one fluoride species, and water, wherein the composition is substantially devoid of oxidizer. In still another embodiment, the germanium selective composition comprises, consists of, or consists essentially of at least one diol compound, at least one oxidizer, and water, wherein the composition is substantially devoid of fluoride species. The species of diol compounds, fluoride species and oxidizers are listed hereinabove in the first aspect. When present, the water is preferably deionized and present in an amount from about 0.1 wt % to about 40 wt %. Preferably, the amount of water in the germanium selective composition is in a range from about 0.1 wt % to about 30 wt %, more preferably in a range from about 0.1 wt % to about 20 wt %. The fluoride content is kept low, below 0.5%, or zero for maximum selectivity. Accordingly, when present, the amount of fluoride species is in a range from about 0.01 wt % to about 0.5 wt %. In the absence of fluoride, a stronger oxidizer such as DCBQ also increases Ge etch rate more than Si etch rate and thus increases selectivity. When present, the amount of oxidizing species is in a range from about 0.01 wt % to about 5 wt %, preferably about 0.1 wt % to 1 wt %. The amount of diol species in the second composition is in a range from about 70 wt % to about 99 wt %, preferably greater than about 75 wt % to about 98.8 wt %.

It should be appreciated that the germanium selective composition can be tuned to alter the etch rates of the silicon-containing materials, the germanium-containing materials and the germanium-containing materials relative to the silicon-containing materials, as readily understood and determined by the person skilled in the art. Most preferably, the selectivity of germanium-containing compounds:silicon-containing compounds (Ge:Si) at 25° C. is greater than about 30:1, more preferably greater than about 40:1, and most preferably greater than about 50:1, with germanium-containing material etch rates greater than about 3 Å/min with a strong oxidant.

In one embodiment, the germanium selective composition of the second aspect comprises, consists of, or consists essentially of 1,2-, 1,3-, or 1,4-butanediol, HF, and water. In another embodiment, the germanium selective composition of the second aspect comprises, consists of, or consists essentially of 1,2-, 1,3-, or 1,4-butanediol, methyl-1,4-benzoquinone or DCBQ, and water.

In a third aspect, a non-selective semiconductor etch (NSSE) composition and a method of using same is described for the cleaning or enlarging of vias having SiGe materials having different Si/Ge ratios, and optionally films and/or substrates of Si and Ge. The non-selective semiconductor etch composition should be mild/controllable enough to clean and etch all exposed silicon-containing and germanium-containing materials at the same rate. In other words, the non-selective semiconductor etch composition should have etch rates of silicon-containing materials that are substantially the same as those of germanium-containing materials. The compositions may be any of the first aspect or second aspect that satisfy the etch rate criteria.

It will be appreciated that it is common practice to make concentrated forms of the compositions to be diluted prior to use. For example, the compositions may be manufactured in a more concentrated form and thereafter diluted with water, additional water, at least one diol, or additional diol(s) at the manufacturer, before use, and/or during use at the fab. Dilution ratios may be in a range from about 0.1 part diluent:1 part composition concentrate to about 100 parts diluent:1 part composition concentrate. If a quinone is used as the oxidant, a concentrated solution (e.g. 5-10%) of the quinone in an oxidation-resistant, preferably aprotic solvent, e.g., sulfolane or tetraglyme, can be used as the source of quinone to be added to the formulation shortly before use.

The compositions described herein are easily formulated by simple addition of the respective ingredients and mixing to homogeneous condition. Furthermore, the compositions may be readily formulated as single-package formulations or multi-part formulations that are mixed at or before the point of use, preferably multi-part formulations. The individual parts of the multi-part formulation may be mixed at the tool or in a mixing region/area such as an inline mixer or in a storage tank upstream of the tool. It is contemplated that the various parts of the multi-part formulation may contain any combination of ingredients/constituents that when mixed together form the desired composition. The concentrations of the respective ingredients may be widely varied in specific multiples of the composition, i.e., more dilute or more concentrated, and it will be appreciated that the compositions can variously and alternatively comprise, consist or consist essentially of any combination of ingredients consistent with the disclosure herein.

In a fourth aspect, the invention relates to methods of using the compositions of the first, second or third aspects described herein. For example, a method of selectively removing silicon-containing material from the surface of a microelectronic device relative to germanium-containing material using the silicon selective composition is contemplated. Alternatively, a method of selectively removing germanium-containing material from the surface of a microelectronic device relative to silicon-containing material using the germanium selective composition is contemplated. In still another alternative, a method of removing silicon-containing material from the surface of a microelectronic device at substantially the same rate as that of germanium-containing material using the NSSE composition is contemplated.

In etching applications, the specific composition having the preferred end result is applied in any suitable manner to the surface of the microelectronic device, e.g., by spraying the composition on the surface of the device, by dipping (in a static or dynamic volume of the composition) of the device, by contacting the device with another material, e.g., a pad, or fibrous sorbent applicator element, that has the composition absorbed thereon, by contacting the device including the silicon nitride material with a circulating composition, or by any other suitable means, manner or technique, by which the composition is brought into removal contact with the silicon-containing materials and the germanium-containing materials. The application may be in a batch or single wafer apparatus, for dynamic or static cleaning.

In use of the compositions of the first, second or third aspects described herein for, the composition typically is contacted with the device structure for a sufficient time of from about 1 minute to about 200 minutes, preferably about 5 minutes to about 60 minutes, at temperature in a range of from about 20° C. to about 100° C., preferably about 25° C. to about 70° C. Such contacting times and temperatures are illustrative, and any other suitable time and temperature conditions may be employed that are efficacious to achieve the required removal selectivity.

In one embodiment, the composition is heated inline during delivery to the device structure. By heating inline, rather than in the bath itself, the composition life increases.

Following the achievement of the desired etching action, the composition can be readily removed from the microelectronic device to which it has previously been applied, e.g., by rinse, wash, or other removal step(s), as may be desired and efficacious in a given end use application of the compositions of the present invention. For example, the device may be rinsed with a rinse solution including deionized water and/or dried (e.g., spin-dry, $N_2$, vapor-dry etc.). If germanium or a high-germanium film is exposed, the preferred rinse is substantially non-aqueous, e.g., isopropyl alcohol (IPA).

Yet another aspect of the invention relates to the improved microelectronic devices made according to the methods described herein and to products containing such microelectronic devices.

Another aspect of the invention relates to an article of manufacture comprising, consisting of or consisting essentially of a microelectronic device substrate, a silicon-containing material, a germanium-containing material, and a composition of the first, second or third aspect as described herein.

The features and advantages of the invention are more fully shown by the illustrative examples discussed below.

Example 1

Silicon selective compositions were prepared and the etch rates of germanium, germanium oxide and poly-Si was determined. In the compositions, the solvent is the balance of the composition. Coupons having blanketed germanium, germanium oxide and poly-Si thereon were immersed in each composition for 30 min at 25° C. and the amount of the respective material removed determined. The silicon selective compositions and results are shown in Table 1.

TABLE 1

Silicon selective compositions

| Formulation | Solvent | HF/wt % | DIW/wt % | oxidizer/wt % | Ge loss/Å | poly-Si loss/Å | Si:Ge selectivity |
| --- | --- | --- | --- | --- | --- | --- | --- |
| A | 1,2-BD | 0.5 | 0.5 | 0.2 MBQ | 2.67 | 25.39 | 9.51 |
| B | 1,3-BD | 0.5 | 0.5 | 0.2 MBQ | 4.41 | 18.59 | 4.22 |
| C | 1,4-BD | 0.5 | 0.5 | 0.2 MBQ | 7.25 | 28.05 | 3.87 |
| D | 1,2-BD | 0.5 | 20 | 0.2 MBQ | 13.53 | 81.74 | 6.04 |
| E | 1,3-BD | 0.5 | 20 | 0.2 MBQ | 21.02 | 103.44 | 4.92 |
| F | 1,4-BD | 0.5 | 20 | 0.2 MBQ | 24.95 | 125.38 | 5.03 |
| G | EG | 0.5 | 0.5 | 0.2 MBQ | 18 | 56 | 3.11 |
| H | PG | 0.5 | 0.5 | 0.2 MBQ | 8 | 25 | 3.13 |
| I | 1,2-BD | 0.5 | 20 | 0.177 BQ | 57 | 196 | 3.44 |
| J | 1,2-BD | 0.5 | 20 | 0.29 DCBQ | 92 | 1010 | 10.98 |
| K | 1,2-BD | 0.5 | 20 | 0.223 DMBQ | 36 | 35 | 1 |
| L | 1,2-BD | 0.5 | 20 | 0.2 MBQ | 28 | 82 | 2.93 |
| M | EG | 0.5 | 20 | 0.2 MBQ | 63 | 234 | 3.71 |
| N | PG | 0.5 | 20 | 0.2 MBQ | 23 | 123 | 5.35 |

BD = butanediol
MBQ = methyl-1,4-benzoquinone (i.e., toluquinone)
EG = ethylene glycol
PG = propylene glycol
BQ = 1,4-benzoquinone
DCBQ = 2,6-dichloro-1,4-benzoquinone
DMBQ = 2,6-dimethyl-1,4-benzoquinone It can be seen from the results in Table 1 that silicon-containing materials can be etchingly removed preferentially relative to germanium-containing materials and that the selectivity of removal is readily tuned based on the components selected. Moreover, silicon selective composition can be tuned to alter the etch rates of the silicon-containing materials.

It is proposed by the inventors that a formulation such as formulation K may be useful as a NSSE composition, as introduced herein.

Example 2

Germanium selective compositions were prepared and the etch rates of germanium, germanium oxide and poly-Si was determined. In the compositions, the solvent is the balance of the composition. Coupons having blanketed germanium, germanium oxide and poly-Si thereon were immersed in each composition for 30 min at 25° C. and the amount of the respective material removed determined. The germanium selective compositions and results are shown in Table 2.

TABLE 2

Germanium selective compositions

| Formulation | Solvent | HF/wt % | DIW/wt % | oxidizer/wt % | Ge loss/Å | poly-Si loss/Å | Ge:Si selectivity |
|---|---|---|---|---|---|---|---|
| AA | 1,2-BD | | 0.5 | | 0.75 | 0.05 | 15 |
| BB | 1,3-BD | | 0.5 | | 0.87 | 0.07 | 12.42 |
| CC | 1,4-BD | | 0.5 | | 0.53 | 0.08 | 6.63 |
| DD | 1,2-BD | | 20 | | 1.53 | −0.99 | >100 |
| EE | 1,3-BD | | 20 | | 6.68 | 0.08 | 83.5 |
| FF | 1,4-BD | | 20 | | 11.58 | 0.13 | 89.08 |
| GG | 1,2-BD | 0.5 | 0.5 | | 0.78 | 0.36 | 2.17 |
| HH | 1,3-BD | 0.5 | 0.5 | | 3.23 | 0.11 | 29.36 |
| II | 1,4-BD | 0.5 | 0.5 | | 8.80 | 0.08 | 110 |
| JJ | 1,2-BD | 0.5 | 20 | | 0.71 | 5.77 | 0.12 |
| KK | 1,3-BD | 0.5 | 20 | | 9.83 | 7.46 | 1.32 |
| LL | 1,4-BD | 0.5 | 20 | | 34.80 | 6.72 | 5.18 |
| MM | 1,2-BD | | 20 | 0.2 MBQ | 8.87 | 0.59 | 15.03 |
| NN | 1,3-BD | | 20 | 0.2 MBQ | 10.19 | 0.16 | 63.69 |
| OO | 1,4-BD | | 20 | 0.2 MBQ | 16.64 | 0.24 | 69.33 |
| PP | EG | 0.5 | 0.5 | | 5 | 8 | 0.63 |
| QQ | PG | 0.5 | 0.5 | | 3 | 34 | 0.09 |
| RR | EG | 0.5 | 20 | | 19 | 12 | 1.58 |
| SS | PG | 0.5 | 20 | | 7 | 8 | 0.88 |
| TT | 1,2-BD | | 20 | 0.177 BQ | 24 | 0 | >100 |
| UU | 1,2-BD | | 20 | 0.290 DCBQ | 117 | 0 | >100 |
| VV | 1,2-BD | | 20 | 0.223 DMBQ | 12 | 0 | >100 |
| WW | 1,2-BD | | 20 | 0.2 MBQ | 11 | 0 | >100 |
| XX | EG | | 20 | | 4 | 0 | >100 |
| YY | EG | | 20 | 0.2 MBQ | 31 | 9 | 3.44 |
| ZZ | PG | | 20 | | 3 | 0 | >100 |
| AAA | PG | | 20 | 0.2 MBQ | 22 | 0 | >100 |

It can be seen from the results in Table 2 that germanium-containing materials can be etchingly removed preferentially relative to silicon-containing materials although the etch rate of the germanium-containing materials is not particularly high in most cases. That said, it can be seen that the germanium selective composition can be formulated to achieve Ge losses greater than 20 Å over 30 minutes, and greater than 100 Å in one case (UU) where a stronger oxidant is used. It is expected that the data can be extrapolated at higher etching temperatures.

Some observations that can be extrapolated from Tables 1 and 2 include: (a) the etch rate of germanium is more affected by water than that of silicon; (b) the etch rate of silicon is affected more by the oxidizers than that of germanium; (c) the etch rate of germanium is affected less by the presence of fluoride than that of silicon; and (d) the aliphatic tail of the diols may be a good inhibitor of germanium etch rate.

While the invention has been described herein in reference to specific aspects, features and illustrative embodiments of the invention, it will be appreciated that the utility of the invention is not thus limited, but rather extends to and encompasses numerous other variations, modifications and alternative embodiments, as will suggest themselves to those of ordinary skill in the field of the present invention, based on the disclosure herein. Correspondingly, the invention as hereinafter claimed is intended to be broadly construed and interpreted, as including all such variations, modifications and alternative embodiments, within its spirit and scope.

What is claimed is:

1. A method of selectively removing silicon-containing material from the surface of a microelectronic device relative to germanium-containing material, said method comprising:

providing a microelectronic device comprising silicon-containing material and germanium-containing material; and selectively etching the silicon-containing material relative to the germanium-containing material by contacting a silicon selective composition with the surface of the microelectronic device for time and temperature necessary to selectively remove silicon-containing material relative to germanium-containing material, wherein the silicon selective composition comprises from about 70 wt % to about 99 wt % of at least one diol compound, from about 0.01 wt % to about 5 wt % of at least one fluoride species, and from about 0.01 wt % to about 10 wt % of at least one oxidizing species.

2. The method of claim 1, wherein the silicon selective composition further comprises water.

3. The method of claim 1, wherein the at least one diol species comprises a species selected from the group consisting of ethylene glycol, neopentyl glycol, propylene glycol, 1,3-propanediol, 1,2-butanediol, 1,3-butanediol, 1,4-butanediol, 1,2-pentanediol, 1,3-pentanediol, 1,4-pentanediol, 2,3-butanediol, 3-methyl-1,2-butanediol, 1,5- pentanediol, 2-methyl-1,3-pentanediol, 2,4-pentanediol, 2-methyl-2,4-pentanediol, 2,3-pentanediol, 1,2-hexanediol, 2-ethyl-1,3-hexanediol, 2,5-dimethyl-2,5-hexanediol, 1,2-octanediol and combinations thereof.

4. The method of claim 1, wherein the at least one fluoride species comprises a species selected from the group consisting of hydrofluoric acid, hexafluorotitanic acid, hexafluorosilicic acid, hexafluorozirconic acid, tetrafluoboric acid, tetrabutylammonium trifluoromethanesulfonate, tetraalkylammonium tetrafluoroborates ($NR_1R_2R_3R_4BF_4$), tetraalkylammonium hexafluorophosphates ($NR_1R_2R_3R_4PF_6$), tetraalkylammonium fluorides ($NR_1R_2R_3R_4F$), ammonium bifluoride, ammonium fluoride, where $R_1$, $R_2$, $R_3$, $R_4$ may be the same as or different from one another and is selected from the group consisting of hydrogen, straight-chained or branched $C_1$-$C_6$ alkyl groups, $C_1$-$C_6$ alkoxy groups, or substituted or unsubstituted aryl groups.

5. The method of claim 1, wherein the at least one oxidizing species comprises a species selected from the group consisting of hydrogen peroxide, $FeCl_3$, $FeF_3$, $Fe(NO_3)_3$, $Sr(NO_3)_2$, $CoF_3$, $MnF_3$, oxone ($2KHSO_5 \cdot KHSO_4 \cdot K_2SO_4$), periodic acid, iodic acid, vanadium (V) oxide, vanadium (IV, V) oxide, ammonium vanadate, ammonium peroxomonosulfate, ammonium chlorite, ammonium chlorate, ammonium iodate, ammonium nitrate, ammonium perborate, ammonium perchlorate, ammonium periodate, ammonium persulfate, ammonium hypochlorite, ammonium hypobromite, ammonium tungstate, sodium persulfate, sodium hypochlorite, sodium perborate, sodium hypobromite, potassium iodate, potassium permanganate, potassium persulfate, nitric acid, potassium persulfate, potassium hypochlorite, tetramethylammonium chlorite, tetramethylammonium chlorate, tetramethylammonium iodate, tetramethylammonium perborate, tetramethylammonium perchlorate, tetramethylammonium periodate, tetramethylammonium persulfate, tetrabutylammonium peroxomonosulfate, peroxomonosulfuric acid, ferric nitrate, urea hydrogen peroxide, peracetic acid, methyl-1,4-benzoquinone (MBQ), 1,4-benzoquinone (BQ), 1,2-benzoquinone, 2,6-dichloro-1,4-benzoquinone (DCBQ), toluquinone, 2,6-dimethyl-1,4-benzoquinone (DMBQ), chloranil, alloxan, N-methylmorpholine N-oxide, trimethylamine N-oxide, and combinations thereof.

6. The method of claim 2, wherein the amount of water in the silicon selective composition is in a range from about 0.1 wt % to about 40 wt %.

7. The method of claim 1, wherein the selectivity of silicon-containing compounds relative to germanium-containing compounds at 25° C. is greater than 3:1 with silicon-containing material etch rates greater than 4 Å/min.

8. The method of claim 1, wherein time is in a range of from about 1 minute to about 200 minutes at temperature in a range of from about 20° C. to about 100° C.

9. The method of claim 1, wherein the silicon-containing materials comprise at least one of silicon; n-doped silicon; p-doped silicon; silicon oxide, gate oxides; TEOS; silicon nitride; thermal oxide; SiOH; SiCOH; titanium silicide; tungsten silicide; nickel silicides; cobalt silicides; and low-k dielectric materials.

10. The method of claim 1, wherein the germanium-containing materials comprise at least one of a bulk germanium wafer, n-doped germanium, p-doped germanium, a germanium-on-insulator (GOI) wafer, a germanium layer on a substrate, titanium germanide, tungsten germanide, nickel germanide, and cobalt germanide.

11. The method of claim 5, wherein the at least one oxidizing species comprises any of the quinones, hydrogen peroxide, peracetic acid, and ammonium iodate.

* * * * *